United States Patent
Masumoto

(10) Patent No.: US 7,851,264 B2
(45) Date of Patent: Dec. 14, 2010

(54) SEMICONDUCTOR DEVICE SINGULATION METHOD

(75) Inventor: Mutsumi Masumoto, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/400,499

(22) Filed: Mar. 9, 2009

(65) Prior Publication Data

US 2009/0197373 A1      Aug. 6, 2009

Related U.S. Application Data

(63) Continuation of application No. 11/552,351, filed on Oct. 24, 2006, now Pat. No. 7,521,291.

(30) Foreign Application Priority Data

Oct. 25, 2005  (JP)  .............................. 2005-309728

(51) Int. Cl.
   *H01L 21/00*  (2006.01)
(52) U.S. Cl. ................. 438/113; 438/458; 257/E21.596
(58) Field of Classification Search .................. 438/106, 438/107, 108, 113, 123, 127, 458, 460
   See application file for complete search history.

(56) References Cited

U.S. PATENT DOCUMENTS

| 2005/0116321 A1* | 6/2005 | Li et al. ....................... 257/666 |
| 2005/0263864 A1* | 12/2005 | Islam et al. .................. 257/676 |
| 2006/0097366 A1* | 5/2006 | Sirinorakul et al. ......... 257/666 |

* cited by examiner

*Primary Examiner*—Chuong A Luu
*Assistant Examiner*—Nga Doan
(74) *Attorney, Agent, or Firm*—Yingsheng Tung; Wade J. Brady, III; Frederick J. Telecky, Jr.

(57) ABSTRACT

The objective of the invention is to provide a semiconductor device manufacturing method with which the generation of burrs can be suppressed while increasing the singulation speed of the package. In a manufacturing method of a QFN package of the present invention, a molding prepared by sealing a lead frame with plural semiconductor chips carried on it en bloc with a resin; the operation comprises the following processing steps: a first singulation processing step S101 in which the molding is half-cut along the cutting plane; a de-flashing processing step S102 in which the burrs on the cut portion of the half-cut molding are removed; and a second singulation processing step S103 in which the de-flashed molding is completely cut along the cutting plane.

13 Claims, 5 Drawing Sheets

SEMICONDUCTOR DEVICE SINGULATION METHOD

This application is a continuation of application Ser. No. 11/552,351, filed Oct. 24, 2006, the contents of which are herein incorporated by reference in its entirety.

FIELD OF THE INVENTION

The present invention pertains to a semiconductor device manufacturing method. More specifically, the present invention pertains to a method for manufacturing a QFN (Quad Flat Non-leaded) package.

Accompanying the popularization of cell phones, notebook personal computers, and other small electronic devices has been a great demand to reduce the size and thickness of the semiconductor devices carried in them. Together with BGA and CSA packages, the SON (Small Outline Non-leaded) and QFN packages have been adopted in practical application as small packages using lead frames.

FIG. 5a is an inner side view of the QFN package. FIG. 5b is a cross section along A-A of FIG. 5a. For QFN package 10, lead frame 12 and semiconductor chip 16 carried on its mounting area 14 are sealed with resin 18. From its inner surface, plural leads 20 and mounting area 14 are exposed. Said plural leads 20 are aligned in four directions on the inner surface of the package and form the external leads. Also, plural leads 20 are electrically connected to the surface electrodes of semiconductor chip 16 via bonding wires 22 in resin 18.

Because plural leads 20 protrude from resin 18 in QFN package 10, it is possible to reduce the assembly area on the wiring substrate, which is advantageous. Also, since mounting area 14 is free of resin 18, heat generated in the interior can be dissipated well to the outside with high efficiency. However, the QFN package also includes a structure in which mounting area 14 is sealed in resin 18. The SON package contains a structure in which the opposing external leads in two directions on the inner surface of the package are exposed.

As shown in FIG. 6, Patent Reference 1 discloses a method in which, after semiconductor chips 39 carried on islands 33 of the lead frame are sealed with resin layer 41, resin layer 41 and the lead frame are cut simultaneously with the blade of a dicing device along cutting lines 44 so that individual semiconductor devices are formed.

As shown in FIG. 7, Patent Reference 2 discloses a method in which recess 1j is formed corresponding to dicing line 1h at cut portion 1k of lead frame 1 supporting semiconductor chip 2; at said recess 1j, division is performed with blade 6, so that cutting burr 1i can be reduced, protrusion of cutting burr 1i on plane 1d to be connected at each lead 1a can be prevented, the flatness of plane 1d to be connected to lead 1a is improved, and the assembly of QFN 5 can be enhanced.

Patent Reference 1: Japanese Kokai Patent Application No. Hei 11[1999]-176856

Patent Reference 2: Japanese Kokai Patent Application No. 2002-261193

BACKGROUND OF THE INVENTION

In a QFN package, after the entire lead frame on which plural semiconductor chips are mounted is sealed with resins, singulation is performed with a dicing device to form individual packages. The dicing device has a rotating blade, and by moving the blade along the cutting line, the leads exposed on the inner surface of the package and the resin are cut simultaneously. However, when the moving velocity of the blade reaches, e.g., 30 mm/s or higher, numerous metal burrs are generated on the cutting plane of the lead frame. Said burrs are generated not only in the direction in which the blade is moved (i.e., the cutting direction), but also in the plate thickness direction of the lead frame.

FIG. 8 is a photograph of a cutting plane that was formed by moving the blade at a velocity of 30 mm/sec. The white portions correspond to the cutting plane of the lead, while the black portion corresponds to the cutting plane of the resin. As can be seen from this photograph, burrs appear in the cutting direction. Because the clearance between the leads is small, the burrs in the cutting direction lead to short-circuit problems, such as solder bridges, etc., when leads with a narrow pitch are assembled on a wiring substrate. Also, because the burrs in the plate thickness direction of the leads protrude from the inner surface of the package, the planarization (flatness) of the QFN package will be poor, and when it is assembled on the wiring substrate, the connections to the lands of the wiring substrate will also be poor, which is undesirable.

On the other hand, in order to suppress generation of burrs, the cutting velocity of the blade may be reduced. However, this drops the singulation throughput. The technologies disclosed in said Patent References 1 and 2 suggest nothing about improving the singulation throughput.

The purpose of the present invention is to solve the aforementioned problems of the prior art by providing a semiconductor device manufacturing method characterized by the fact that the speed of singulation of packages by means of dicing is increased, while suppressing the generation of burrs.

SUMMARY OF THE INVENTION

The present invention provides a method for manufacturing a semiconductor device which contains semiconductor chips and a lead frame with mounting areas and plural leads that are sealed with a resin, characterized by the fact that it comprises the following processing steps: (a) a processing step in which plural semiconductor chips are mounted on the various mounting areas of the lead frame, and in which the electrodes of each semiconductor chip are electrically connected to the corresponding lead; (b) a processing step in which the lead frame and the plural semiconductor chips are sealed with a resin so that at least a portion of each lead is exposed; (c) a first cutting processing step in which a dicing blade is driven to move along the cutting plane, and at least the leads are fully cut; (d) a processing step in which the cut portion obtained by cutting in said first cutting processing step is de-flashed; and (e) a second cutting processing step in which a dicing blade is driven to move along the cutting plane to cut the remaining portion of the resin.

In a preferred scheme, the de-flashing processing step includes a chemical treatment in which the leads and resin exposed at the cut portion are exposed to an alkaline or acidic solution. This may be performed by dipping (immersing) in the solution at about 82° C. for 25 min. The lead frame, which is made of copper or is copper that has been plated with solder or palladium, may be treated with Kaline 300 solution, a strong alkaline aqueous solution. By dipping in said solution, the copper chemically reacts with the Kaline 300, so that parts of the burrs dissolve, the molded compound resin swells, and the burrs on the cut portion can be completely and easily removed subsequently by applying a jet of water.

In a preferred scheme, in the first cutting processing step, the blade may be driven to move at least at a velocity of 100 mm/sec. Although burrs are formed due to high-speed cutting, all of said burrs can be removed during said de-flashing treatment. In the second cutting processing step, because only the resin is cut, the cutting velocity can be higher than that in the first cutting processing step. Also, the width of the blade in the second cutting processing step can be smaller than the width of the blade in the first cutting processing step. As a result, it is possible to increase the cutting velocity. In this way, it is possible to perform dicing at a high speed, and it is thus possible to increase the singulation throughput.

Also, the injection of high-pressure water during the de-flashing process may be performed during the first cutting processing step or the second cutting processing step. It is preferred that it be performed during the first cutting processing step. Also, the chemical treatment is not a requirement.

The lead frame may be made of copper, iron-nickel alloy (such as Fe-42Ni), or copper that has been plated with solder or palladium. According to the present invention, it is possible to manufacture QFN or SON packages without burrs that exhibit excellent dimensional precision and flatness.

According to the present invention, when the plural semiconductor chips mounted on the lead frame are singulated, the leads that are exposed from the resin are completely cut through by the blade. Then, the cut portion is de-flashed, followed by cutting of only the resin with the blade. Consequently, the cutting speed during singulation can be increased, and the burrs can almost be entirely removed from the leads in the cutting plane. As a result, it is possible to provide a semiconductor device with excellent dimensional precision and flatness.

BRIEF DESCRIPTIONS OF THE DRAWINGS

FIG. 1 is a flow chart illustrating the manufacture of a QFN package in an embodiment of the present invention.

FIG. 2: FIG. 2a is a plan view of the molding before resin sealing. FIG. 2b is a plan view of the molding prepared by resin sealing.

FIG. 3: FIG. 3a is a cross section along B-B of FIG. 2b. FIG. 3b is an enlarged cross section of part C shown in FIG. 3a.

FIG. 5 illustrates the QFN package. FIG. 5b is a cross section along 5b-5b in 5a.

REFERENCE NUMERALS AND SYMBOLS AS SHOWN IN THE DRAWINGS

In the figures, 100 represents a lead frame, 102 represents a semiconductor chip, 104 represents mounting areas, 106 represents a hanging portion, 108 represents a main body rail portion, 110 represents a bonding wire, 112 represents a lead, 120 represents a molding resin, 130 represents a blade, 140 represents a cut slot, and L represents a cutting plane.

DESCRIPTION OF THE EMBODIMENTS

In the following, an explanation will be given in more detail regarding a preferred embodiment of the present invention with reference to the attached figures.

Figure 1A:
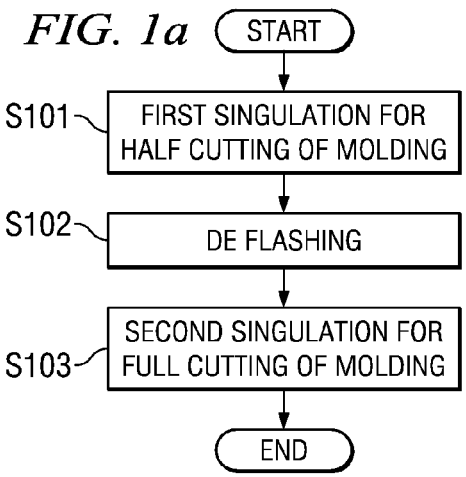

FIG. 1 is a flow chart illustrating the manufacturing process of the QFN package in an embodiment of the present invention. In the present embodiment, a molding prepared by sealing a lead frame with plural semiconductor chips mounted on it en bloc with a resin. The operation comprises the following processing steps: a first singulation processing step S101 in which the molding is half cut along the cutting plane; a de-flashing processing step S102 in which the burrs on the cut portion of the half-cut molding are removed; and a second singulation processing step S103 in which the de-flashed molding is completely cut along the cutting plane.

Figure 2A:
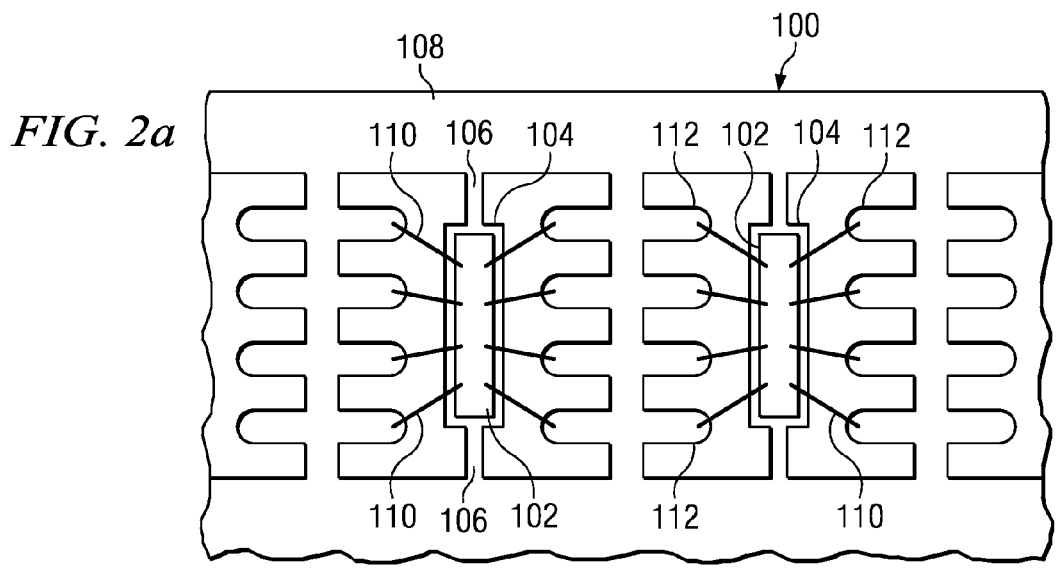
Figure 2B:
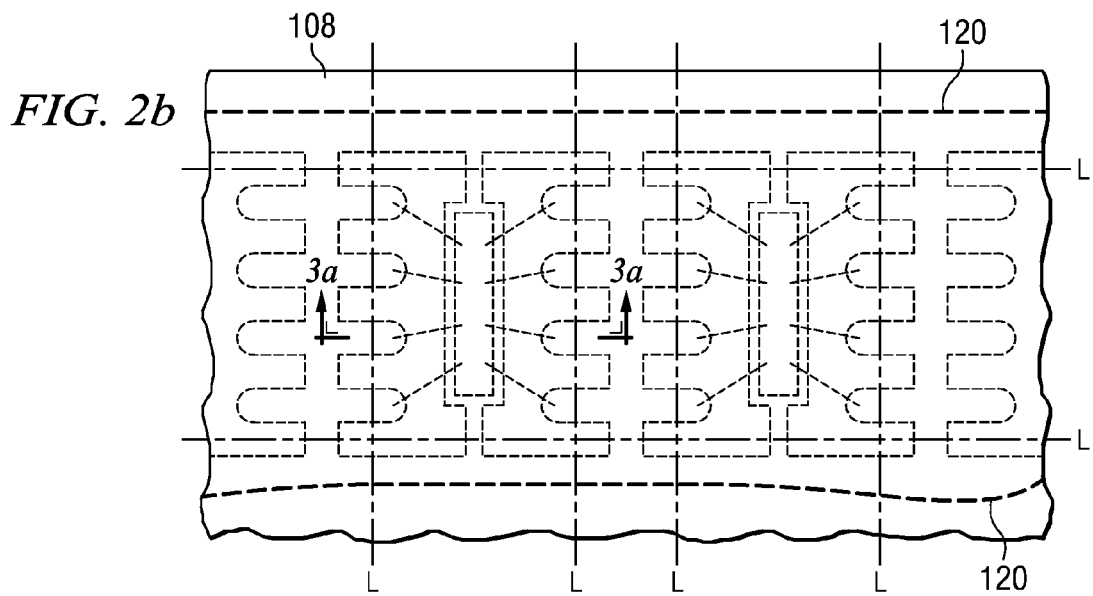

FIG. 2a is a plan view of the molding before resin sealing. FIG. 2b is a plan view of the resin sealed molding. As shown in FIG. 2a, plural mounting areas 104 carrying semiconductor chips 102 are formed on lead frame 100. Said mounting areas 104 are arranged in a linear or two-dimensional configuration. The two sides of said mounting areas 104 are in contact with main body rail portion 108 by means of hanging portions 106. Semiconductor chips 102 are fixed on mounting areas 104 by means of solder paste or the like. The electrodes formed on the surface of semiconductor chips 102 are connected to corresponding leads 112 by means of bonding wires 110.

It is preferred that lead frame 100 be made of copper whose surface has been plated with palladium or solder. Also, it may be made of iron-nickel alloy (42 Alloy). Said lead frame 100 has a plate thickness in the range of 150-200 μm, and it is processed by stamping or etching to the desired shape.

Figure 3A:
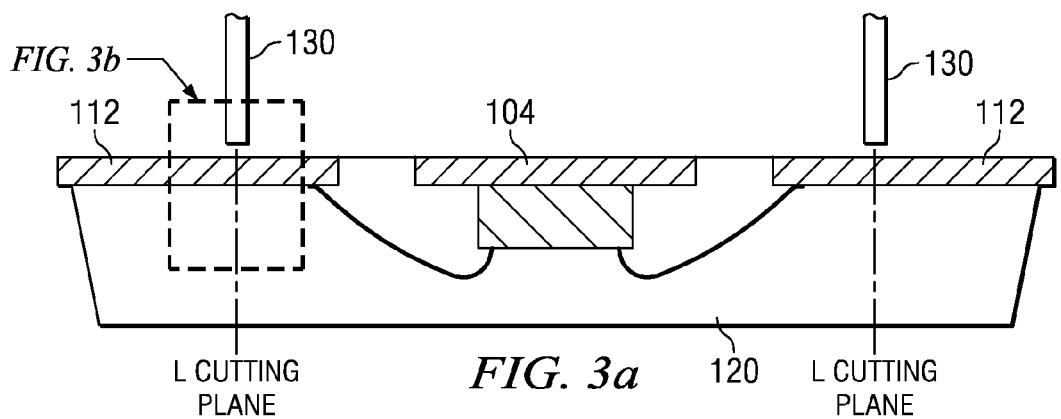

The lead frame shown in FIG. 2a is sealed en bloc with a resin by means of the transfer molding method, and, as shown in FIG. 2b, semiconductor chips 102 and leads on lead frame 100 are sealed en bloc with resin 120. As shown in FIG. 3a, a cross section along B-B in FIG. 2b, after sealing with resin 120, mounting areas 104 and leads 112 are exposed from resin 120.

Then, as shown in FIG. 3a, the molding sealed with resin is fixed to an adhesive sheet so that the exposed surfaces of leads 112 and mounting areas 104 face upward, and a dicing device is used to perform half-cut singulation.

The dicing device has blade 130 with a width of about 300 μm, and it moves while the blade is driven to rotate. As shown in FIGS. 2b and 3a, blade 130 is driven to move along cutting plane L, and the height of blade 130 is adjusted so that it is positioned so that at least leads 112 are completely cut.

Figure 3B:
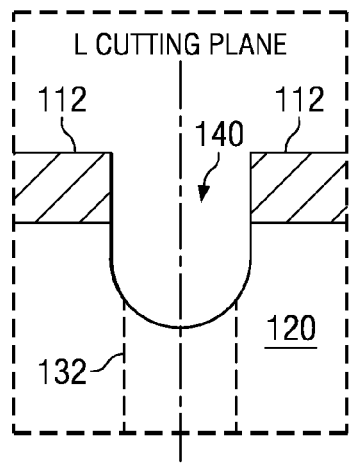

FIG. 3b is a diagram illustrating the half-cut state of the cutting plane of part C shown in FIG. 3a. As blade 130 is driven to move along cutting plane L at a velocity of at least 100 mm/sec, cut slot 140 is formed on cutting plane L. Said cut slot 140 has a depth of about 300 μm from the surface of leads 112. This depth is sufficient for completely cutting leads 112 having a plate thickness of about 150-200 μm. Said blade 130 also cuts a portion of resin 120 when leads 112 are cut. The bottom portion of cut slot 140 becomes a curved surface corresponding to the curvature of the tip of blade 130. The thickness of resin 120 is about 700 μm, and, in the processing step of half-cutting, most of resin 120 is left.

Figure 1B:
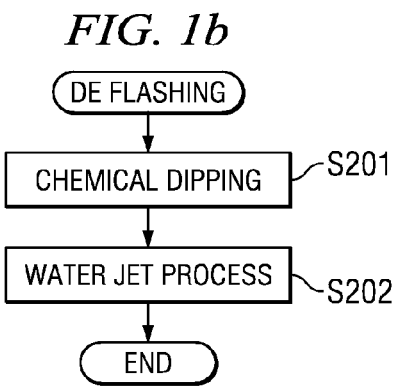

Then, the half-cut molding is transferred to the de-flashing processing step. Because the cutting velocity of blade 130 is high, many burrs are generated on the cutting plane. Such burrs are removed during the de-flashing processing step. In a preferred scheme, as shown in FIG. 1b, this consists of two processing steps, that is, chemical dipping (immersing) and subjection to a water jet.

In the chemical dipping processing step, a strong alkaline solution, such as Kaline 300, is loaded in a container, and its temperature is kept at about 82° C. The half-cut molding is immersed in said container for about 25 min. When the lead frame is made of copper, the burrs generated on the cutting plane chemically react with the Kaline 300 as acute alkali, so that part of the burrs are dissolved. Also, the Kaline 300 swells the molding resin compound. Due to said swelling, the adherence between resin 120 and leads 112 is slightly relieved. Also, if the lead frame is made of another material, such as 42 Alloy, the solvent is selected appropriately so that it chemically reacts with the lead frame to dissolve it.

Then, the molding is removed from the container and rinsed. Then, the molding is transferred for application of a water jet. During the water jet process, high-pressure water is sprayed on cut slot 140. As a result, the burrs on leads 112 in cut slot 140 can be completely removed. Also, since the adherence is reduced due to the swelling, the burrs are completely removed, so that no burrs are left in cut slot 140, and a clean cutting plane is obtained.

Then, the molding is subjected to full cut singulation with the dicing device. In this case, because the blade only cuts resin region 132 of cut slot 140 shown in FIG. 3b, the cutting velocity of blade 130 can be higher than that during the first singulation, and resin 120 can be cut at a higher speed. The width of the blade used during full-cut singulation is smaller than that of blade 130 used in the half-cut singulation. Consequently, the cutting plane of the cut semiconductor device has a stepped shape. Also, the materials of the blades may be different depending on whether the metal can be cut.

Figure 4:
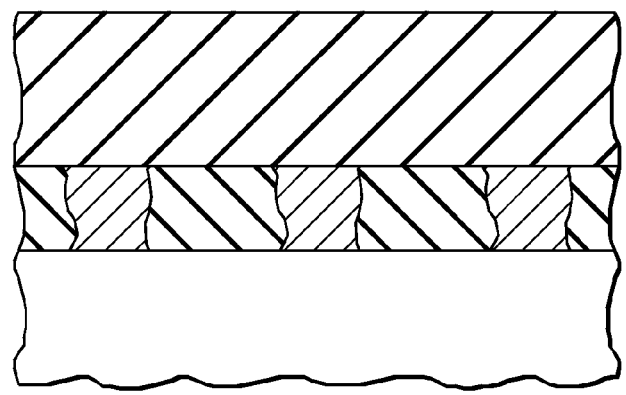
FIG. 4 is a photograph illustrating the cutting plane of the QFN package cut using the manufacturing method of the present embodiment.
Figure 5A:
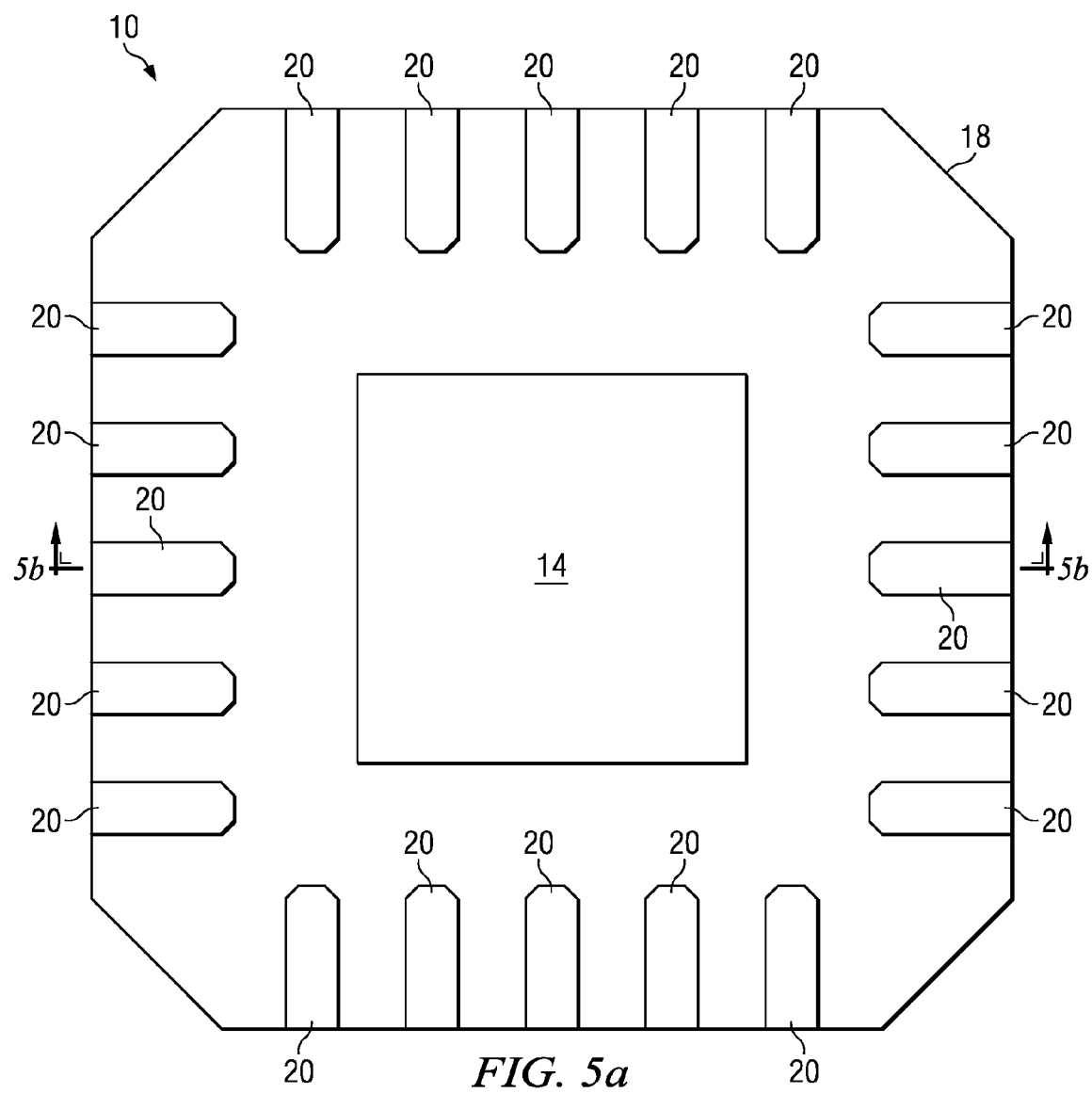
FIG. 5a is an inner surface view.
Figure 5B:
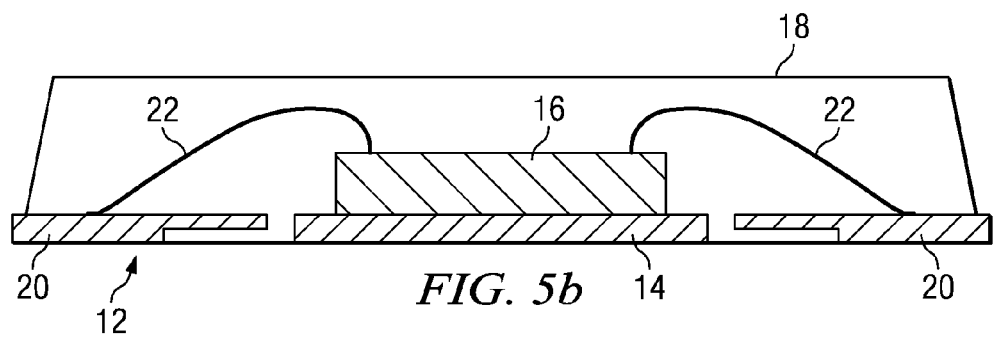
Figure 6A:
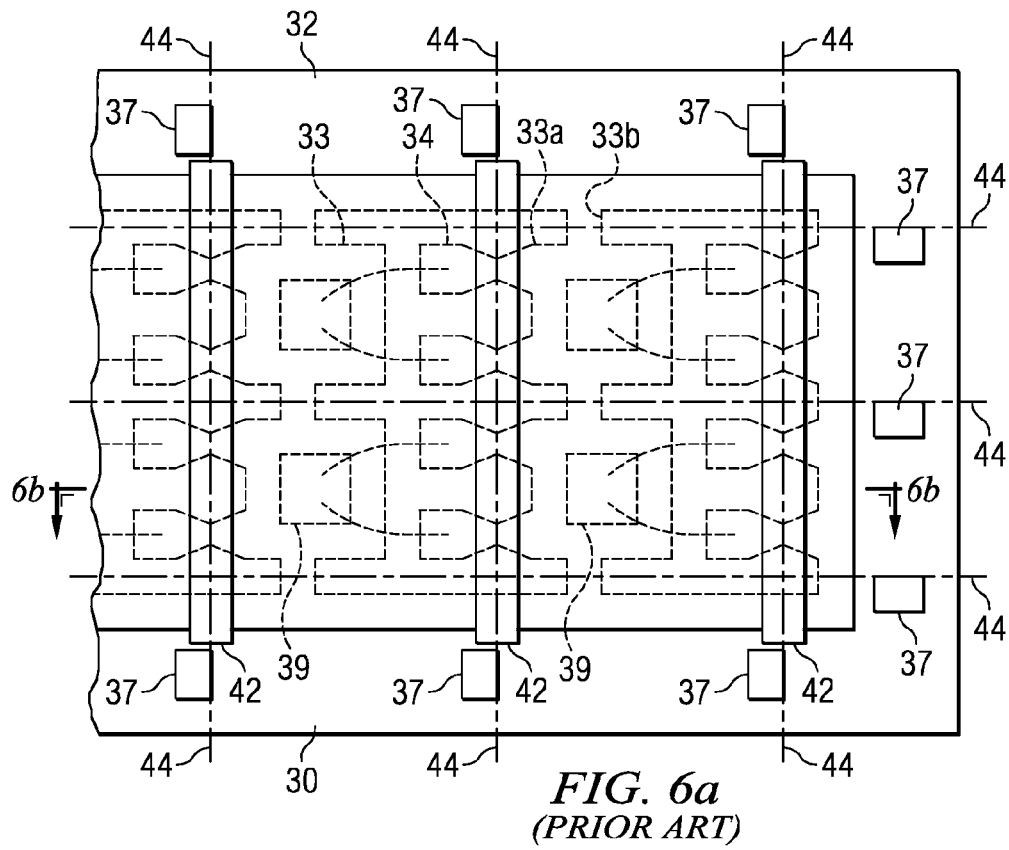
FIG. 6 is a diagram illustrating a semiconductor device manufacturing method of the prior art.
Figure 6B:
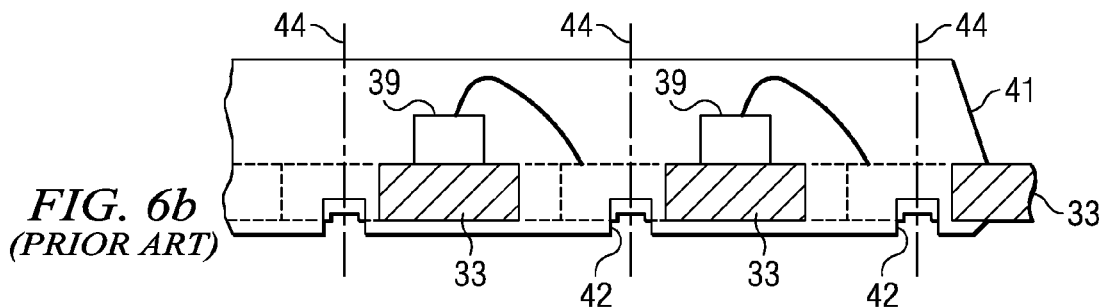
Figure 7A:
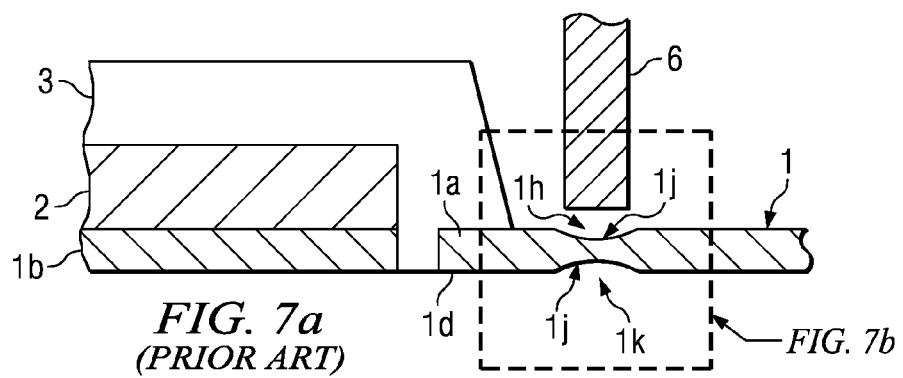
FIG. 7 is a diagram illustrating a of semiconductor device manufacturing method of the prior art.
Figure 7B:
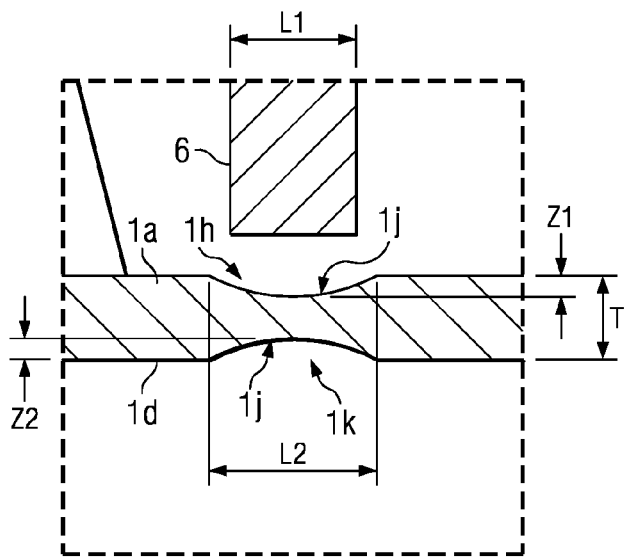
Figure 7C:
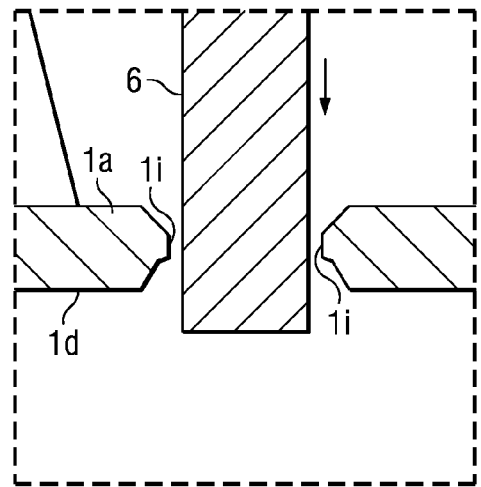
Figure 8:
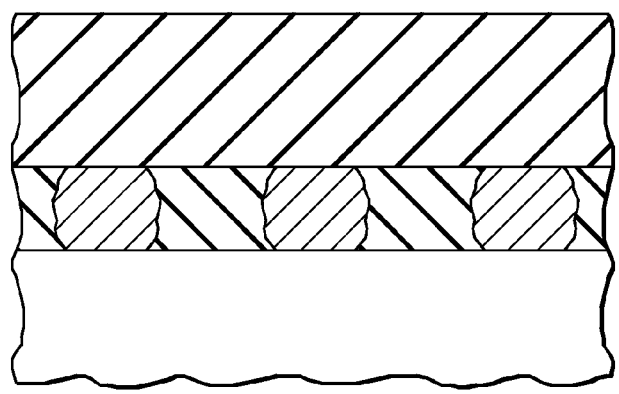
FIG. 8 is a photograph illustrating a cross section of a QFN package of the prior art.

FIG. 4 is a photograph illustrating the cutting plane of the QFN package obtained using the manufacturing method of the present embodiment. The white portion corresponds to the cutting plane of the lead, and the black portion corresponds to the cutting plane of the resin. As can be seen from the photograph, compared to the manufacturing method of the prior art (see FIG. 8), the burrs in the cutting direction of the leads can be completely removed, and the burrs in the plate thickness of the leads also can be completely removed.

As explained above, according to the present embodiment, singulation of the QFN package is divided into two processing steps, and de-flashing is performed after the half-cut. Consequently, it is possible to simultaneously cut the leads and the resin with the blade at speeds of 100 mm/sec or more. As a result, the burrs can be neatly removed by means of de-flashing. As a result, the singulation throughput can be increased, and the dimensional precision and flatness of the leads of the obtained QFN package are excellent.

An embodiment of the present invention was explained above in detail. However, the present invention is not limited to this scheme. For example, one may also adopt various modifications and changes as long as the essence of the present invention as described in the claims is observed.

In said embodiment, a manufacturing method for a QFN package has been presented. Of course, it may also be applied to the singulation of other semiconductor device packages, such as SON, etc. Also, it is possible to make appropriate changes to the configuration and shape of the leads, and a portion of the leads may be sealed in the resin. Also, it is not required that the mounting areas be exposed from the resin. In addition to the wire bonding, it is also possible to use tab leads or other connection schemes for the semiconductor chips. Molding of the resin may also be performed by means of a potting operation instead of the transfer molding operation.

In said embodiment, the de-flashing process includes two processing steps, namely, chemical dipping and water jet processes. However, it is also possible perform only the water jet process without performing the chemical dipping operation. In this way, the de-flashing processing step also can be realized. In this case, the water jet processing step may be performed independently of the first and second singulation processing steps. It may be performed simultaneously with the first singulation processing step or with the second singulation processing step. When the water jet process is performed simultaneously with a singulation processing step, it is preferred that it be performed simultaneously with the first singulation processing step in which the lead frame is cut.

The semiconductor device manufacturing method of the present invention can reliably provide a small, very thin semiconductor device.

What is claimed is:

1. A method for manufacturing a semiconductor device, and which contains semiconductor chips sealed with a resin and a lead frame with leads, comprising the following processing steps:
   (a) severing the leads connected to two semiconductor chips with a first dicing blade at a first speed in a first cutting processing step;
   (b) continuing the first cutting process step to form a first cut in a first portion of the resin and leaving a second portion of the resin adjacent the first portion uncut;
   (c) extending the first cut with a second dicing blade at a second speed faster than the first speed through the second portion of the resin in a second cutting processing step; and
   (d) removing burrs from the severed leads with liquid chemical before completion of the second cutting process step.

2. The manufacturing method described in claim 1, in which the removing processing step includes spraying high-pressure water at the first cut.

3. The manufacturing method described in claim 1, in which the removing processing step includes exposing the leads and the first cut portion to an alkaline or acidic solution.

4. The manufacturing method described in claim 3, in which the exposing includes dipping the semiconductor device in the solution at a constant temperature for a prescribed period of time.

5. The manufacturing method described in claim 4, in which the removing includes a spraying of high-pressure water after exposing the leads to the solution.

6. The manufacturing method described in claim 2, in which the spraying process is performed concurrently with the first cutting processing step or the second cutting processing step.

7. The manufacturing method described in claim 1, in which the width of the blade in the second cutting processing step is smaller than the width of the blade in the first cutting processing step, forming a step in the resin.

8. The manufacturing method described in claim 1, in which in the first cutting processing step, the blade is driven to move at a velocity of at least 100 mm/sec.

9. The manufacturing method described in claim 1, in which the depth of the cut formed in the first cutting processing step is about twice the thickness of the leads.

10. The manufacturing method described in claim 1, in which the depth of the cut formed in the first cutting processing step is approximately equal to the width of the dicing blade.

11. The manufacturing method described in claim 1, in which the lead frame contains copper, iron-nickel alloy, or copper plated with solder or palladium.

12. The manufacturing method described in claim 1, in which the semiconductor device is a QFN package.

13. The manufacturing method described in claim 1, in which the semiconductor device is an SON package.

* * * * *